United States Patent [19]
Lucas

[11] 4,087,793
[45] May 2, 1978

[54] DIGITAL ELECTRONIC CONTROL AND SWITCHING ARRANGEMENT

[75] Inventor: Alfred Raymond Lucas, Coral Springs, Fla.

[73] Assignee: Motorola, Inc., Schaumburg, Ill.

[21] Appl. No.: 736,658

[22] Filed: Oct. 28, 1976

[51] Int. Cl.² .......................... H04B 1/16; H04Q 9/00
[52] U.S. Cl. .......................... 340/168 R; 340/168 CC;
325/464; 340/311; 343/228; 340/171 R; 340/312; 340/164 R
[58] Field of Search ............ 340/168 R, 168 CC, 311; 325/464, 397, 398, 394, 408

[56] References Cited

U.S. PATENT DOCUMENTS

| | | | |
|---|---|---|---|
| 3,651,469 | 3/1972 | Keese | 340/168 R |
| 3,869,672 | 3/1975 | Schroder | 340/168 R |
| 3,968,440 | 7/1976 | Ehni | 325/464 X |
| 3,973,228 | 8/1976 | Mueller | 325/464 X |

*Primary Examiner*—Harold I. Pitts
*Attorney, Agent, or Firm*—Margaret Marsh Parker; James W. Gillman

[57] ABSTRACT

A variable control, such as for a gain or frequency control, having a delay period and switching function at each end point, with status or level indication, is comprised of two simple switches and appropriate logic circuitry. While a first switch is closed the gain would be reduced, at a predetermined rate, to a minimum point and held there for a brief interval during which a warning tone may be sounded. If the switch is still closed at the end of the interval, an auxiliary function is enabled. When a second switch is closed, the auxiliary function is disenabled and gain increases at the predetermined rate. If the second switch is kept closed until maximum gain is reached and beyond, the warning tone is sounded for an interval, then a different function is enabled. The unit will remain in that mode until the first switch is again closed. Still another function may be enabled by simultaneous closing of both switches. A visual status readout can be activated whenever either switch is closed.

32 Claims, 2 Drawing Figures

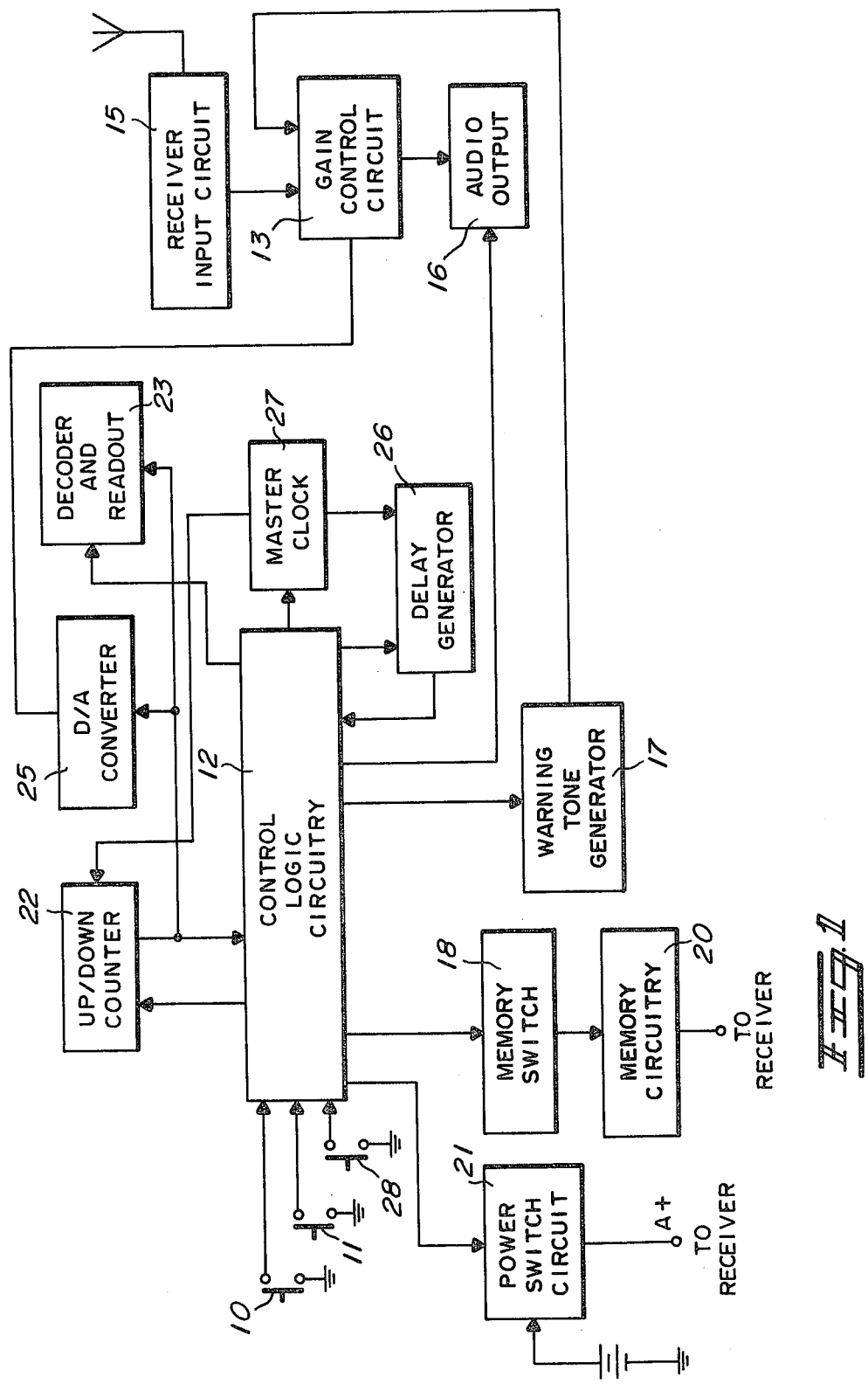

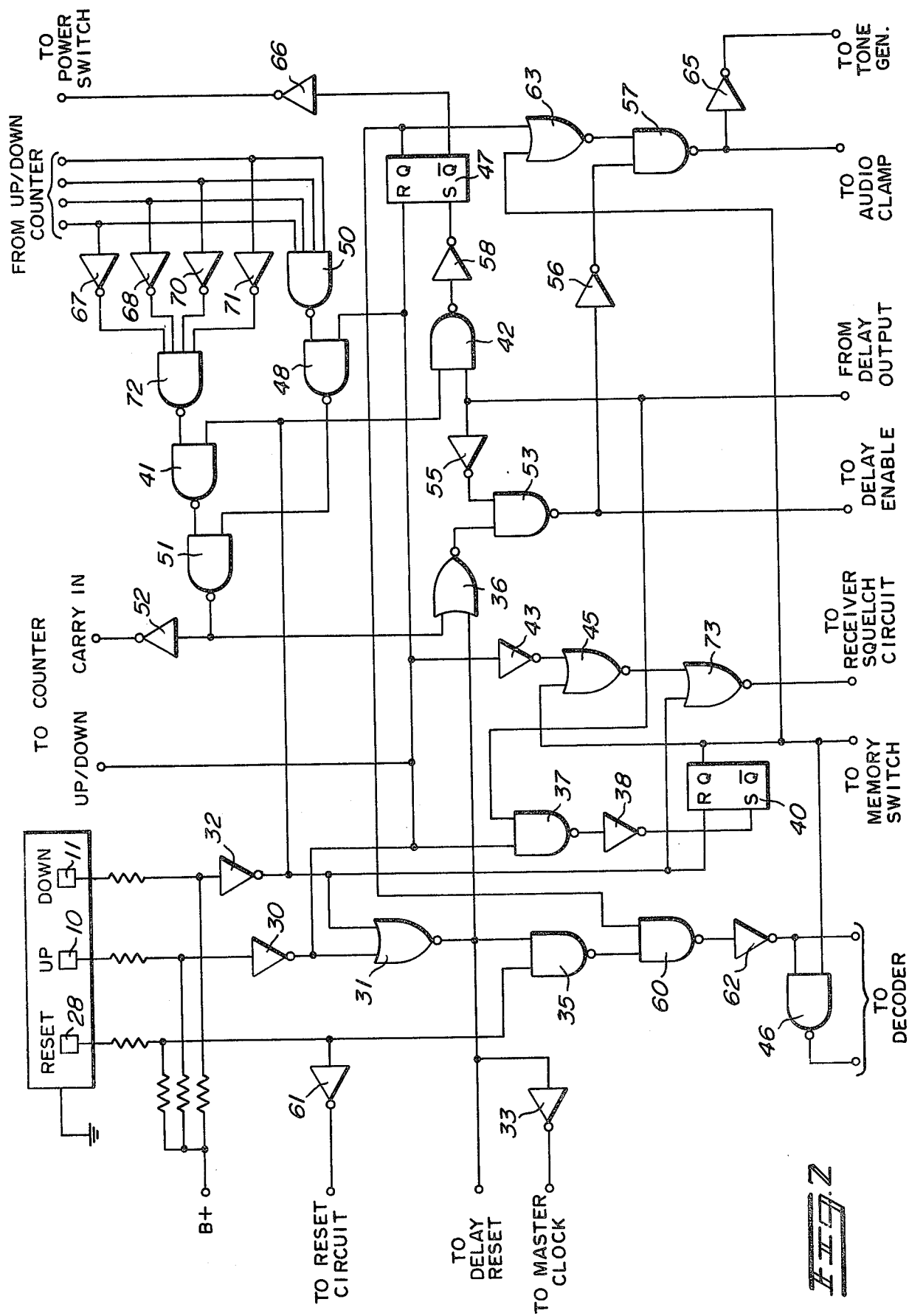

DIGITAL ELECTRONIC CONTROL AND SWITCHING ARRANGEMENT

BACKGROUND OF THE INVENTION

This invention relates to the field of controls, and particularly to an improved digital control for electronic apparatus.

As electronic equipment has become increasingly miniaturized, manual controls have become more of a problem. Decreasing the size of controls such as potentiometers increases cost and causes more failures due to dust and wear. Eventually, a limiting point is reached in size reduction. Thus, a new technology rather than mere miniaturization of the old technology was required. Solid state electronic devices and logic circuitry were probably first used for replacing potentiometers as in volume control circuits in response to the desire for remote television controls. In these devices, depressing a button or buttons on a hand-held device sends a signal to the television console. Upon being received, this acoustical or electromagnetic signal is typically translated into a voltage for causing rotation of the shaft of a turret-type tuner switch by a motor or stepping relay. Control of volume has also been accomplished by the transmission and reception of a similar signal with an on-off function provided at the minimum volume setting. In miniature devices such as pocket pagers, the size of controls is even more of a problem since other functions besides simply running volume up and down and turning the receiver off are desirable. It is particularly desirable to have a brief delay period during which the user receives some type of warning before the apparatus turns off or another function is enabled.

SUMMARY OF THE INVENTION

It is therefore an object of the present invention to provide control and switching functions in electronic apparatus using digital electronic circuitry.

It is a particular object to provide these functions by an arrangement comprising, inter alia, two contact switches and logic circuitry, whereby additional functions are enabled at the extreme end points of the controls, following a brief delay period during which an indication is given of the end point condition.

It is another particular object to provide a status indication as the functions are controlled.

It is still another object to provide still another function by simultaneous operation of the two switches.

The above objectives are provided in accordance with the invention by a digital control, including digital circuitry activated by two simple switches. The closing of an UP switch turns on power and causes an UP/DOWN counter to start counting up. The output of this counter, through a digital-to-analog converter, controls another circuit such as a gain stage for controlling the volume in a receiver or the like. If the UP switch remains closed after the first counter reaches its maximum, a second counter starts counting up and a warning tone generator is activated. At a predetermined count of the second counter, the tone generator is deactivated. Simultaneously, an auxiliary function such as "memory mode" operation is activated and remains activated until the DOWN switch is closed. The second counter is reset by the opening of both switches. When the DOWN switch is closed, the first counter begins to count down, lowering the gain, until the counter minimum is reached. If the DOWN switch is still closed beyond this point, again the second counter is activated and the warning tone sounds. At the predetermined count, the tone stops and power is removed from all circuitry not necessary for reactivation of the unit. A visual display may be coupled to the UP/DOWN counter to provide a level status readout if so desired. Simultaneous closing of the UP and DOWN switches can also initiate another function as desired.

BRIEF DESCRIPTION OF THE DRAWING

In the drawing,

FIG. 1 is a block diagram of a system including the invention.

FIG. 2 is logic diagram of circuitry in accordance with the invention.

DETAILED DESCRIPTION OF A PREFERRED EMBODIMENT

An embodiment of the present invention is described hereinbelow in the context of a pocket pager for illustrative purposes, but it is to be noted that there is no intention to so limit it and no such limitation should be inferred.

In FIG. 1 a block diagram of a pocket pager is shown as an illustrative application of the invention. An UP switch 10 and a DOWN switch 11 are connected to logic circuitry 12 for controlling a gain control circuit 13 coupled between a receiver input circuit 15 and an audio output circuit 16, thus the volume of the pocket pager is controlled by the user thereof. Other portions of the pager include a warning tone generator 17, a memory switching circuit 18 and memory circuitry 20. In the environment of a pager, the warning tone generator 17 could be the same tone generator used to notify the user that he is being paged. The generator 17 can be coupled directly to the audio output 16, but the connection to the gain control circuit is preferred. The warning tone output level preceding turn-off is then at a very low level, as would be desirable in many situations. The memory switch 18 and circuitry 20 may be of the type known in the art for use in a memory mode operation wherein incoming calls do not alert the user immediately. Such calls are stored or "remembered" and when the memory switch is switched back for normal operation, the user is notified that a call was received during the interim.

The operation of a pager including the invention is as follows: closing the UP switch 10 activates a power switch circuit 21 to supply power to all parts of the pager previously unpowered. The "power-off" operation will be described hereinafter. The switch 10 also activates an UP/DOWN counter 22. The UP switch 10 may be any type of momentary-contact, single pole single throw switch, such as a "bubble type" switch, a capacity-coupled or a resistance contact switch which will be "open" when finger contact is removed. As long as the switch contact is maintained closed, the counter 22 will count up until its highest state is reached. In a preferred embodiment, a four-bit counter is used, giving sixteen discrete volume settings but providing almost imperceptible transitions. The counter state may be indicated visually by coupling the counter output to a decoder and readout 23. This decoder may be a Motorola MC14511 BCD-to-seven segment latch/decoder/driver, or the equivalent. The readout may be composed of LED's or LCD's. By coupling the "0", "2" and "4" inputs of the decoder 23 to the "2", "4" and "8" outputs of the counter 22, and grounding the "8" decoder input, LED readouts of 0–7 will be given for sixteen of the discrete volume levels. That is, for a "0" or "1" output from the counter 22, the display would read "0". For a "14" or "15" output, the display would read "7". When the UP switch 10 is still closed at the end of the delay period, NAND 46 will put a low on the "LT" or Lamp Test input, providing an "8" readout on the LED to indicate an auxiliary mode operation.

While the gain moves smoothly through sixteen discrete levels, the readout provides eight indications. These indications plus an auxiliary mode indication can thus be provided with a one digit display. The counter state is coupled to the gain control circuit 13 through a digital-to-analog converter 25. If the UP/DOWN counter 12 (and the gain level) reach their highest point, a delay generator 26 is enabled. The delay generator 26 is an UP counter and, like the counter 22, is coupled to a master clock or stable multivibrator 27 which may be adjustable. The delay generator 26 and the UP/DOWN counter 22 may be Motorola MC14516 low-power complementary MOS binary counters or the equivalent. At the end of a predetermined delay period the delay generator 26 triggers the memory switch 18 to activate the memory circuitry 20, as is known in the art. During the delay period, the warning tone generator 17 is also enabled, thus providing the user with a warning that the gain is at its maximum level and that the unit will be switched to the memory mode if the UP switch 10 is maintained in "closed" condition. A "RESET" switch 28 is also shown connected to the logic circuit 12. This switch may provide manual capability for turning the receiver off at the end of a message. This switch could also provide push-to-listen (after alert), push-to-monitor, or other desired functions. It is of particular interest in the present invention that simultaneous closing of switches 10 and 11 and the addition of an AND gate could replace the function of the switch 28.

In FIG. 2, the control logic circuitry is shown in more detail. This is intended to be exemplary since it is well known in the art that there are a number of equivalent configurations for any logic circuit or element.

The UP switch 10 is connected through a divider network to an inverter 30 which is coupled to a NOR gate 31. Similarly, the DOWN switch 11 is coupled though a divider network to an inverter 32 which is coupled to the NOR gate 31. The divider networks would not be required if the switches are simple mechanical switches. The output of the NOR gate 31 is coupled to the reset of the delay generator 26 and, through an inverter 33 to the master clock 27, to a NAND gate 35, and to a NOR gate 36. The inverter 30 output is also coupled to a NAND gate 37, the second input of which comes from the output of the delay generator 26. The NAND gate 37 output is coupled through an inverter 38 to the S input of an RS flip-flop 40. The inverter 32 output is also coupled to a NAND gate 41 and to a NAND gate 42, the second input of the latter coming from the output of the delay generator 26. The inverter 30 output is also coupled through an inverter 43 to a NOR gate 45, a second input of which comes from the Q output of the flip-flop 40. This Q output also couples to the memory switch 18 and to a NOR gate 46, the output of which may be coupled to the decoder and readout 23.

The output of the inverter 30 is also coupled to the reset, "R", input of a second RS flip-flop 47 and to a NAND gate 48. The Q outputs of the UP/DOWN counter 22 are coupled through a four-input NAND gate 50 to a second input of the NAND gate 48 which outputs to a NAND gate 51. The NAND gate 51 is coupled through an inverter 52 to the carry in of the UP/DOWN counter 22. NAND gate 51 is also coupled to a second input of the NOR gate 36 which outputs to a NAND gate 53. A second input of the NAND gate 53 comes through inverter 55 and the output of the NAND gate 53 is coupled to the carry in of the delay generator 26 and, through an inverter 56 to a NAND gate 57.

The output of NAND 42, through an inverter 58 is coupled to the Set input of the RS flip-flop 47. The Q output of the flip-flop is coupled through a NAND gate 60, a second input of which comes through the output of NAND 35 which, in turn, has a second input from the Reset switch 28 divider network. The switch 28 is coupled to the reset circuitry through an inverter 61. The NAND 60 outputs through an inverter 62 to the B1 input of the readout decoder 23, and also provides a second input for the NAND 46. The Q output of the flip-flop 47 is also coupled to an input of a NOR gate 63, a second input coming from the Q output of the flip-flop 40. The NOR 63 outputs to a second input of the NAND 57 which outputs through a clamp in the audio circuit 16 and, through an inverter 65, to the tone generator 17. The Q output of the flip-flop 47 is coupled through an inverter 66 to the power switch 21.

The Q outputs of the UP/DOWN counter 22 are coupled through four inverters 67, 68, 70 and 71 respectively, all of which are coupled to a four input NAND gate 72. The NAND 72 outputs to the NAND 41 which, in turn, outputs to the NAND 51. The inverter 32, from the DOWN switch output is also coupled to the Reset of the flip-flop 40 and to an input of a NOR gate 73, the second input of the NOR 73 being from the output of the NOR 45. The output of the NOR 73 is coupled to the receiver squelch circuit.

As to the operation of the logic circuitry, a more functional explanation of FIG. 2 will now be given. Assuming that the pocket pager is "off" and only those parts of the circuit necessary for the "turn-on" function are powered, closing the UP switch 10 will put a "low" on the inverter 30, thus a "high" on one input of the NOR 31, which will output a low. This is inverted by the inverter 33 and coupled to enable the master clock 27 and thus activates the UP/DOWN counter 22 which has been at zero. Since the inverter 30 is also putting a high on the UP/DOWN input of the counter 22, it will count up. The inverter 30 is putting a high on one input of the NAND 48 and, since the counter is not yet at a maximum level, the output of the NAND 50 will be high, thus the output of NAND 48 will be low, the output of NAND 51 will be high. This latter output, inverted, will enable the counter 22. The counter 22 output is coupled (FIG. 1) to the digital-to-analog converter 25 which provides an output to the gain control circuit for controlling the volume level in a pager, for example, many such circuits being known in the art. When the UP switch is released or opened, the gain will be maintained at the same level.

If the UP switch 10 is kept closed long enough, the counter 22 will reach a predetermined maximum state. When this occurs, the NAND 50 will output a low, causing the output of the NAND 48 to output a high to one input of the NAND 51. Also, when the counter reaches its maximum, the inverters 67, 68, 70 and 71 are outputting lows and the NAND 72 is outputting a high to one input of the NAND 41. The other input of the NAND 41 is low since DOWN switch 11 is not closed, thus NAND 41 outputs a high to the other input of the NAND 51. The inverter 52 puts a high on the "carry in" of counter 22, stopping the count at its maximum. The low NAND 51 output and the low NOR 31 output will produce a high output from NOR 36. The high output of NOR 36 and the inverted output of the delay generator 26 put a low on the "carry in" of the delay generator 36. The generator 26 has a constant source on the UP/DOWN input, for counting up only and, as shown, the only output is at a binary count of "eight". This delay is, of course, easily changed by simple circuit modifications at the output of the generator 26. The clock input is coupled to the master clock 27 and the preset enable inputs are low so that the delay always starts at 0. It should be emphasized that the output of the NOR 31 is coupled to the reset of the delay generator 26 so that, for delay to occur, the appropriate switch must remain closed after the counter 22 reaches an end point, and for an auxiliary function to be enabled, the switch must be kept closed beyond the end of the predetermined delay period.

The low output of the NAND 53 is coupled through the inverter 56 to the NAND 57. The second input of the NAND 57 is from NOR 63 which outputs a high if neither the flip-flop 47 or the flip-flop 40 has a high Q, meaning that the unit is not in "off" or "memory" mode. The low output of the NAND 57 thus results from these conditions; the UP switch is closed, the maximum volume level has been reached, and the delay period is beginning. The inverter 65 then activates the warning tone generator 17 until the delay counter reaches its predetermined maximum level.

At the end of the delay and warning period, the delay generator 26 will output a high and, if the UP switch 10 is still closed, the NAND 53 will output a high. In this event, the delay generator is disenabled, and the NAND 57 will output a high, turning off the warning tone. Simultaneously, NAND 37, through inverter 38, will cause the flip-flop 40 to operate the "memory" switch 18. The switch 18 may activate a memory circuit 20 for storing call information for subsequent availability. Such a memory circuit may be seen in U.S. Pat. No. 3,742,481, assigned to the same assignee as is the present invention.

The description of the second phase of operation will begin with the pager in memory mode. When the DOWN switch 11 is closed, the NAND 41 will output a low to NAND 51, and enable the counter 22. At the same time the clock 27 is activated and the UP/DOWN of the counter is set for "down", so the counter 22 begins to count down. The DOWN switch also resets the flip-flop 40, switching the pager out of memory mode and allowing any "remembered" calls to be announced.

The volume level can be set at any desired level by closing the DOWN switch 11 as desired, but if the switch 11 is maintained closed long enough, a new sequence occurs. If the counter 22 reaches its minimum, the NAND 72 will output a low to NAND 41 and if the DOWN switch is still closed, the NAND 41 will output a high to NAND 51 and the counter 22 will stop counting. The NOR 36 will output a high to the NAND 53 and since the delay generator 26 is at a zero count, the NAND 53 will enable the generator 26 to begin up and the warning tone generator 17 will be activated.

If the DOWN switch 11 is still closed when the delay reaches its maximum, the delay generator 26 and the tone generator 17 will be stopped. The flip-flop 47 will, through the inverter 66, turn off power to all parts of the circuit not necessary for "turn on". The delay generator 26 is reset to zero whenever both switches are open.

In an alternate embodiment, another switch could be added in the power switch circuit 21 for turning off the same portions of the circuitry turned off by the DOWN switch remaining closed through the delay period and beyond, with one exception; the UP/DOWN counter 22 would remain powered when the receiver power is turned off. In this way, a user could turn on his unit at the same volume level at which it was turned off.

Thus, there has been shown a control arrangement for providing a signal which will increase or decrease with the closing of one of two switches. This signal could be used, for example, to control audio gain. At the maximum level of the signal, a delay period begins, during which a warning tone is sounded. At the end of the delay, assuming the same switch is still closed, the control unit will be switched to a different mode of operation. Closing of the other switch will cause the controlled unit to return to normal operation and the control signal will decrease, causing, for example, the audio gain to be reduced. When the control signal reaches its minimum, a delay and warning tone are initiated. At the end of the delay period, the warning tone is stopped and another mode of operation is initiated. This mode could be a form of "stand-by" operation wherein only those portions of the control unit necessary for "turn-on" are empowered.

It is evident that various modifications and variants of the present invention may be made and it is intended to include all such as may be within the scope of the appended claims.

What is claimed is:

1. A digital electronic control arrangement including in combination:
   first switching means;
   second switching means;
   first counter means coupled to the switching means for counting up and down in response to activation of the first and second switching means respectively;
   logic circuitry including first and second circuit means and coupled to the first counter means for providing a control signal in response to the output of the first counter means;
   delay generator means including second counter means coupled to the logic circuitry and to the first and second switching means for being activated in response to activation of one of the first and second switching means while the first counter means is in a predetermined state; and
   indicator means coupled to the logic circuitry and enabled in response to activation of the second counter means;
   said first circuit means of said logic circuitry being coupled to the first switching means and to an output of the second counter means whereby a first auxiliary signal is provided in response to simultaneous occurrence of activation of the first switching means and a predetermined state of the second counter means, said second circuit means of said logic circuitry being coupled to the second switching means and to the output of the second counter means whereby a second auxiliary signal is provided in response to simultaneous occurrence of activation of the second switching means and the predetermined state of the second counter means.

2. A digital electronic control arrangement according to claim 1 wherein each of the first and second switching means includes a single pole, single throw switch.

3. A digital electronic control arrangement according to claim 1 wherein the logic circuitry includes means for providing a third auxiliary signal when the first and second switching means are activated at the same time.

4. A digital electronic control arrangement according to claim 1 wherein the indicator means is a warning tone generator.

5. A digital electronic control arrangement according to claim 1 wherein the indicator means is a mechanical vibration generator.

6. A digital electronic control arrangement according to claim 1 and further including receiver means coupled to an output of the logic circuitry for being controlled by the control signal.

7. A digital electronic control arrangement according to claim 6 wherein the receiver means includes input circuitry, gain control circuitry and audio output circuitry.

8. A digital electronic control arrangement according to claim 1 and further including first and second auxiliary circuits coupled to the logic circuitry and adapted to be enabled by the first and second auxiliary signals respectively.

9. A digital electronic control arrangement according to claim 8 wherein the first auxiliary circuit is adapted to change the mode of operation of the receiver means.

10. A digital electronic control arrangement according to claim 9 wherein the receiver means is changed to a memory mode of operation.

11. A digital electronic control arrangement according to claim 8 wherein the second auxiliary circuit is adapted to change the mode of operation of the receiver means.

12. A digital electronic control arrangement according to claim 11 wherein the receiver means is disenabled by the second auxiliary circuit.

13. A digital electronic control arrangement according to claim 7 and further including converter means coupled between the output of the first counter means and the input of the gain control circuitry for converting the digital output of the counter means to an analog signal.

14. A digital electronic control arrangement according to claim 1 and further including clock means coupled to the first and second switching means and to the first and second counter means for providing clock pulses to the first and second counter means in response to activation of the first and second switching means.

15. A digital electronic control arrangement according to claim 1 and further including status indicator means coupled to the first and second switching means and to the first counter means for providing a visual indication of the state of the first counter means in response to activation of one of the first and second switching means.

16. A digital electronic control arrangement according to claim 15 wherein the status indicator means comprises a binary decoder coupled to a light emitting diode display.

17. A digital electronic control arrangement according to claim 16 wherein the binary decoder is coupled to the outputs of the first counter means for receiving a single signal in response to one of a pair of output states of the counter means, said pair being represented by 2n and 2n+1 where $n$ is an integer, and for providing a visual readout in response to said signal, the readout being represented by $n$.

18. A digital electronic control arrangement according to claim 15 and wherein the first circuit means is coupled to an input of the status indicator means for providing a visual indication in response to the first auxiliary signal.

19. A digital control for an electronic apparatus normally operating in a predetermined mode comprising:
first switching means having first and second positions;
second switching means having first and second positions;
first counter means adapted to count up when the first switching means is in the first position and to count down when the second switch means in in the first position;
first circuit means coupled to the first counter means for providing a control signal in response to the first counter means output;
delay generator means including second counter means coupled to the first counter means and to the first and second switching means for being enabled in response to one of the first and second switching means being in the first position while the first counter means is in a predetermined state;
indicator means coupled to the first counter means and to the second counter means for providing an indication in response to the predetermined state of the first counter means during activation of the second counter means;
first switching circuit coupled to the first switching means and to the second counter means for providing an output when the first switching means is in the first position and the second counter means reaches a predetermined state;
second switching circuit coupled to the second switching means and to the second counter means for providing an output when the second switching means is in the first position and the second counter means reaches a predetermined state;
second circuit means coupled to the first switching circuit output for enabling the apparatus in a first auxiliary mode; and
third circuit means coupled to the second switching output for enabling the apparatus in a second auxiliary mode.

20. A digital control according to claim 19 wherein the first switching means comprises a single pole, single throw switch and the second switching means comprises a single pole, single throw switch.

21. A digital control according to claim 19 wherein the indicator means comprises a warning tone generator.

22. A digital control according to claim 19 wherein the indicator means comprises a mechanical vibration mechanism.

23. A digital control according to claim 19 wherein the first circuit means comprises converter means for converting the digital output of the first counter means to an analog signal.

24. A digital control according to claim 19 wherein the first auxiliary mode is a memory mode.

25. A digital control according to claim 19 wherein the second auxiliary mode is a standby mode wherein power is removed from parts of the apparatus not necessary for restoration to the predetermined mode.

26. A digital control according to claim 19 wherein the first circuit means is adapted to remove the apparatus from the first auxiliary mode in response to the second switching means passing from the second position to the first position.

27. A digital control according to claim 19 wherein the first circuit means is adapted to remove the apparatus from the second auxiliary mode in response to the first switching means passing from the second position to the first position.

28. A digital control according to claim 19 and wherein the output of the indicator means is adapted to be controlled by the control signal.

29. A digital control according to claim 19 and further including a status indictor means coupled to the first and second switching means and to the first counter means for providing a visual indication of the first counter means state in response to one of the switching means being in the first position.

30. A digital control according to claim 29 wherein the status indicator comprises a decoder and a light-emitting-diode display.

31. A digital control according to claim 30 wherein the decoder is a BCD-to-seven segment latch, decoder, and driver.

32. A digital control arrangement according to claim 1 and further including third switching means for disenabling portions of the arrangement, said portions excluding the first counter means.

* * * * *